(12) United States Patent
Lin

(10) Patent No.: US 6,333,562 B1
(45) Date of Patent: Dec. 25, 2001

(54) MULTICHIP MODULE HAVING STACKED CHIP ARRANGEMENT

(75) Inventor: Chun Hung Lin, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/615,836

(22) Filed: Jul. 13, 2000

(51) Int. Cl.[7] .................................................. H01L 29/40
(52) U.S. Cl. ................................... 257/777; 438/109
(58) Field of Search ................................. 257/777, 686, 257/784, 724, 737, 780; 438/109

(56) References Cited

U.S. PATENT DOCUMENTS

| | | | |
|---|---|---|---|
| 4,862,322 | * | 8/1989 | Bickford et al. .................. 361/386 |
| 5,291,061 | * | 3/1994 | Ball ..................................... 257/686 |
| 5,323,060 | * | 6/1994 | Fogal et al. ........................ 257/777 |
| 5,422,435 | * | 6/1995 | Takiar et al. ...................... 174/52.4 |
| 5,735,030 | | 4/1998 | Orcutt . |
| 5,773,896 | * | 6/1998 | Fujimoto et al. .................. 257/777 |
| 6,005,778 | * | 12/1999 | Spielberger et al. .............. 361/770 |
| 6,051,886 | * | 4/2000 | Fogal et al. ........................ 257/777 |
| 6,097,097 | * | 8/2000 | Hirose ................................ 257/778 |
| 6,222,265 | * | 4/2001 | Akram et al. ..................... 257/723 |
| 6,232,148 | * | 5/2001 | Ma et al. ........................... 438/112 |
| 6,252,305 | * | 6/2001 | Lin et al. ........................... 257/777 |

* cited by examiner

Primary Examiner—David Nelms
Assistant Examiner—Bau T Le

(57) ABSTRACT

A multichip module mainly comprises two stacked chips disposed on and respectively wire bonded to a substrate or a lead frame. There are a plurality of electrically conductive bumps having base portions and pillar protruding portions interposed between the two chips. The conductive bumps are attached at their base portions to the bonding pads of the lower chip and connected at their pillar protruding portions to the backside surface of the upper chip so as to support the upper chip. In the multichip module of the present invention, the pillar protruding portions of bumps help to provide clearance between the two chips for keeping the upper chip from damaging the bonding wires of the lower chip.

15 Claims, 5 Drawing Sheets

MULTICHIP MODULE HAVING STACKED CHIP ARRANGEMENT

BACKGROUND OF THE INVENTION

1. Field of the Invention

This invention generally relates to a multi-chip module (MCM), and more particularly to a multi-chip module having a stacked chip arrangement.

2. Description of the Related Art

As electronic devices have become more smaller and thinner, the packages for protecting and interconnecting IC chips have the same trend, too.

With ever increasing demands for miniaturization and higher operating speeds, multichip modules (MCMs) are increasingly attractive in a variety of electronics. MCMs which contain more than one die can help minimize the system operational speed restrictions imposed by long printed circuit board connection traces by combining, for example, the processor, memory, and associated logic into a single package. In addition, MCMs decrease the interconnection length between IC chips thereby reducing signal delays and access times.

The most common MCM is the "side-by-side" MCM. In this version two or more IC chips are mounted next to each other (or side by side each other) on the principal mounting surface of a common substrate. Interconnections among the chips and conductive traces on the substrate are commonly made via wire bonding. The side-by-side MCM, however, suffers from a disadvantage that the package efficiency is very low since the area of the common substrate increases with an increase in the number of semiconductor chips mounted thereon.

Therefore, U.S. Pat. No. 5,323,060 teaches a multichip stacked device (see FIG. 1) comprising a first semiconductor chip 110 attached to a substrate 120 and a second semiconductor chip 130 stacked atop the first semiconductor chip 110. The chips 110, 120 are respectively wire bonded to the substrate 120. U.S. Pat. No. 5,323,060 is characterized by using an adhesive layer 140 between the two chips to provide clearance between the chips for the loops of the bonding wires 150. The adhesive layer has a thickness greater than the loop height defined by the distance between the active surface of the chip 110 and the vertexes of the outwardly projecting loops of the bonding wires 150 so as to prevent the bonding wires 150 from contacting the chip 130.

Prior art wire bonding techniques make the wire interconnection between the chip bond pad and the substrate contact pad by making a ball bond to the chip bond pad, forming a loop therebetween, and making a stitch bond to the substrate contact pad to finish the wire interconnect. The normal loop height is generally about 10 to 15 mils. As thinner packages have been developed, the loop height has been reduced with conventional bonding techniques down to about 6 mils in height by changes in the loop parameters, profile and wire types. However, this loop height is considered to be a minimum obtainable loop height as attempts to go lower have caused wire damage and poor wire pull strengths.

Therefore, using this conventional bonding technique, the adhesive layer 140 must have a thickness of at least 8 mils to prevent the chip 130 from contacting the bonding wires 150. Typical materials for the adhesive layer 140 include epoxy and tape. However, it is very difficult to form an epoxy layer with a stable bond line thickness above 3 mils. Further, even using a tape with a thickness of 8 mils, it will increase the cost of the final product, and the reliability of resulted package will suffer from the CTE mismatch between thermoplastic tape and silicon chip.

The loop height can be reduced to about 0.002 inches by the use of an entirely different wire bonding technique disclosed in U.S. Pat. No. 5,735,030. Referring now to FIGS. 2 and 12, there is shown a process flow for wire bonding in accordance with U.S. Pat. No. 5,735,030. Initially, as shown in FIG. 12, a protuberance 200 is formed on the chip bond pad 210 by first ball bonding the free end of an electrically conductive wire onto the chip bond pad 210, and thereafter stitch bonding the same wire to its ball bonded end at a point on the wire immediately adjacent the ball bonded end such that the ball bond and stitch bond together form the protuberance 200. Then, using a ball bonding tool, first ball bonding one end of a bonding wire 220 to the substrate contact pad 230 and thereafter stitch bonding the other end of the bonding wire 220 to the protuberance 200 on the chip bond pad 210 (see FIG. 2).

Referring to FIG. 1 and FIG. 2, if the bonding wires 150 are formed by the wire bonding technique disclosed in U.S. Pat. No. 5,735,030, the adhesive layer 140 must have a thickness of at least 4 mils to prevent the chip 130 from contacting the bonding wires 150. However, it is very difficult to form an epoxy layer with a stable bond line thickness above 4 mils. Once the bond line thickness is not stable, it will introduce unsatisfactory coplanarity of the upper chip 130, after mounting of the upper chip 130. Sometimes the bond line thickness is so uneven to cause the chip 130 to come in contact with the loop profile of the lower bonding wires thereby resulting in deformation or shift of the loop profile of the lower bonding wires.

SUMMARY OF THE INVENTION

It is a primary object of the present invention to provide a multi-chip module comprising two chips disposed on means for supporting chips in a stacking arrangement and respectively wire bonded to the supporting means wherein the multi-chip module is characterized by having a plurality of electrically conductive bumps interposed between the stacked chips to serve as a spacer therebetween thereby keeping the upper chip from damaging the bonding wires of lower chip.

The multichip module according to a first preferred embodiment of the present invention comprises two chips disposed on means for supporting chips, e.g., a substrate or a lead frame, in a stacking arrangement. There are a plurality of electrically conductive bumps having base portions and pillar protruding portions interposed between the two chips. The conductive bumps are attached at their base portions to the bonding pads of the lower chip and connected at their pillar protruding portions to the backside surface of the upper chip so as to support the upper chip. In the multichip module according to a first preferred embodiment of the present invention, the pillar protruding portions of bumps help to provide clearance between the two chips for keeping the upper chip from damaging the bonding wires of lower chip.

The multichip module according to a second preferred embodiment of the present invention is characterized by having a plurality of electrically conductive protuberances attached to the bonding pads of the lower chip. The bonding wires for the lower chip have one ends connected to conductive leads of the supporting means by ball bonding and the other ends connected to the protuberances by stitch bonding. Furthermore, there are also a plurality of electrically conductive bumps interposed between the two chips wherein the conductive bumps are attached to the stitch bonding ends of the bonding wires for the lower chip and connected to the backside surface of the upper chip so as to support the upper chip. It should be understood that, in the second preferred embodiment of the present invention, proper clearance between the two chips can be ensured on condition that each of the four corners of the lower chip is provided with several the conductive bumps, thereby keeping the upper chip from damaging the bonding wires of lower chip.

The present invention further provides a method of making a multichip module in accordance with the first embodiment of the present invention. The method comprises the steps of: (a) attaching a lower chip to means for supporting chips; (b) forming a plurality of electrically conductive bumps having base portions and pillar protruding portions, the bumps being attached at its base portions to bonding pads of the lower chip; (c) connecting one ends of a plurality of lower bonding wires to conductive leads of the supporting means by ball bonding and the other ends thereof to the base portions of bumps on the bonding pads of the lower chip by stitch bonding; (d) dispensing an adhesive on the active surface of the lower chip; (e) placing an upper chip into the adhesive until contacting the pillar protruding portions of bumps on the bonding pads of the lower chip; (f) curing the adhesive; and (g) connecting a plurality of upper bonding wires between the conductive leads of the supporting means and bonding pads of the upper chip.

Still further, the present invention provides a method of making a multichip module in accordance with the second embodiment of the present invention. The method comprises the steps of: (a) attaching a lower chip to means for supporting chips; (b) forming a plurality of electrically conductive protuberances on bonding pads of the lower chip; (c) connecting one ends of a plurality of lower bonding wires to conductive leads of the supporting means by ball bonding and the other ends thereof to the protuberances on the bonding pads of the lower chip by stitch bonding; (d) forming a plurality of electrically conductive bumps onto stitch bonding ends of the lower bonding wires; (e) dispensing an adhesive on the active surface of the lower chip; (f) placing an upper chip into the adhesive until contacting the conductive bumps; (g) curing the adhesive; and (h) connecting a plurality of upper bonding wires between the conductive leads of the supporting means and bonding pads of the upper chip.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENTS

Figure 1:
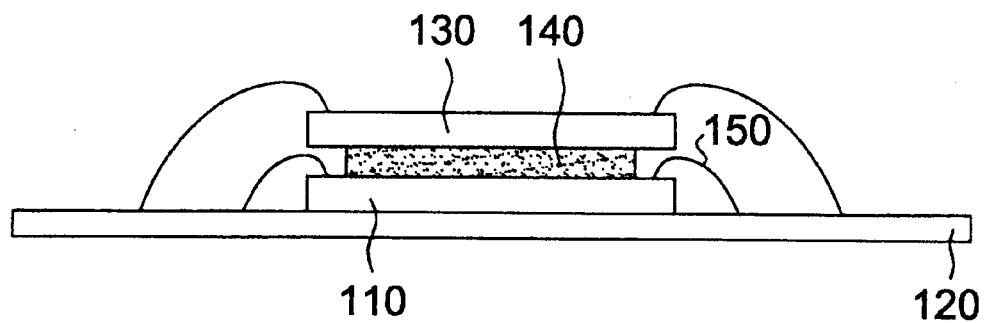
FIG. 1 is a cross sectional view of a conventional multi-chip stacked device.
Figure 2:
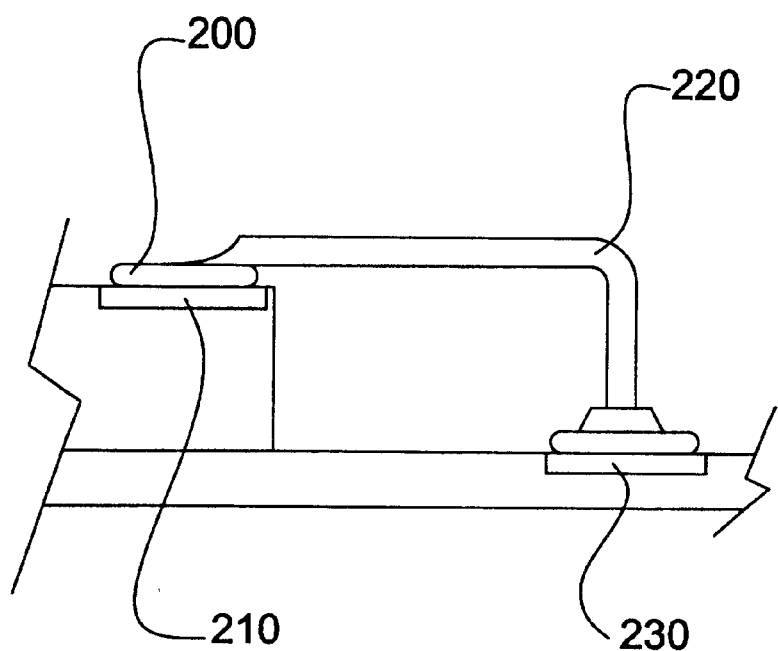
FIG. 2 illustrates a wire bonding method disclosed in U.S. Pat. No. 5,735,030.
Figure 3:
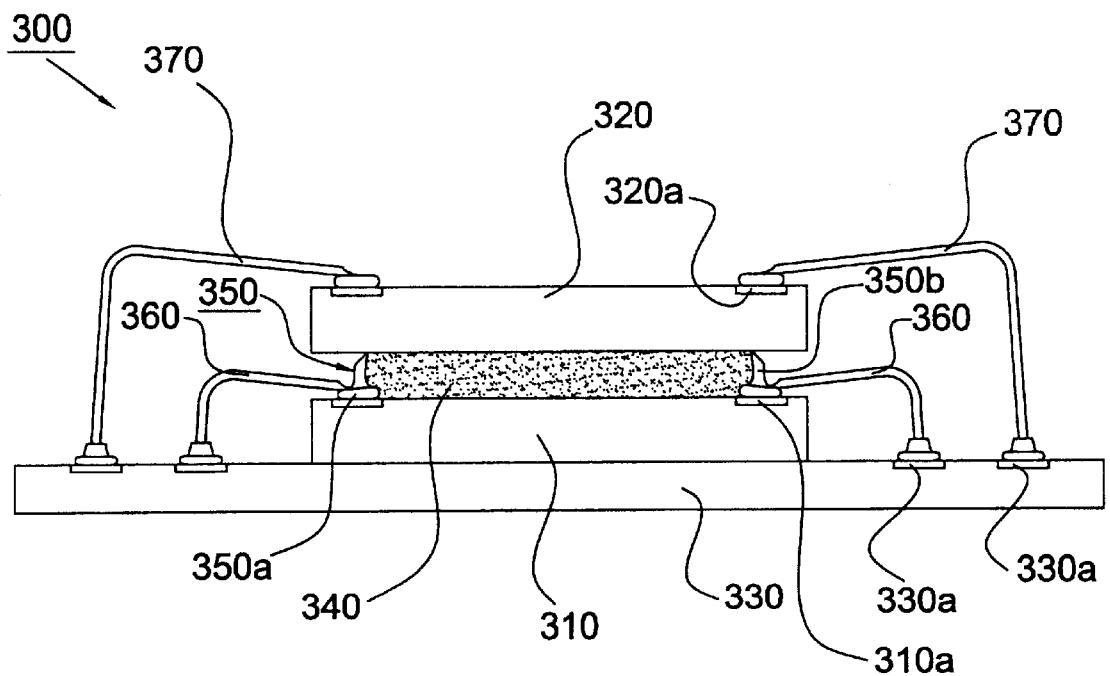
FIG. 3 is a cross sectional view of a multi-chip module according to a first preferred embodiment of the present invention wherein the package body has been removed.

FIG. 3 shows a multi-chip module 300 according to a first preferred embodiment of the present invention wherein the package body has been removed. The multichip module 300 mainly comprises two chips 310, 320 stacked each other and mounted to a substrate 330. The substrate 330 is provided with a structure for making external electrical connection comprising a plurality of conductive leads 330a. Each of the semiconductor chips 310, 320 has a plurality of bonding pads (denoted with the numeral 310a, 320a respectively in FIG. 3) formed on the active surface thereof. The backside surface of the semiconductor chip 310 is attached to the substrate 330 by means of an adhesive (not shown). The backside surface of the semiconductor chip 320 is attached to the active surface of the semiconductor chip 310 through an adhesive layer 340. There are a plurality of electrically conductive bumps 350 having base portions 350a and pillar protruding portions 350b interposed between the two chips. The conductive bumps 350 are attached at their base portions 350a to the bonding pads 310a of the chip 310 and connected at their pillar protruding portions 350b to the backside surface of the chip 320 so as to support the chip 320. The two chips 310, 320 are electrically connected to the conductive leads 330a of the substrate 330 through a plurality of bonding wires 360, 370, respectively. The bonding wires 360 have one ends connected to the conductive leads 330a by ball bonding and the other ends connected to the base portions 350a of the bumps 350 on the bonding pads 310a by stitch bonding. The multi-chip module 300 preferably comprises a package body (not shown) encapsulating the chips 310, 320 and the bonding wires 360, 370 against a portion of the substrate 330.

In the multichip module 300 of the present invention, the pillar protruding portions 350b of bumps 350 help to provide clearance between the two chips 310, 320 thereby keeping the chip 320 from damaging the bonding wires 360. It is noted that the conductive bumps 350 interposed between the two chips have substantially the same height. This provides sufficient coplanarity of the upper chip 320 mounted to the lower chip 310 thereby enhancing the reliability of the multichip module 300.

Figure 4:
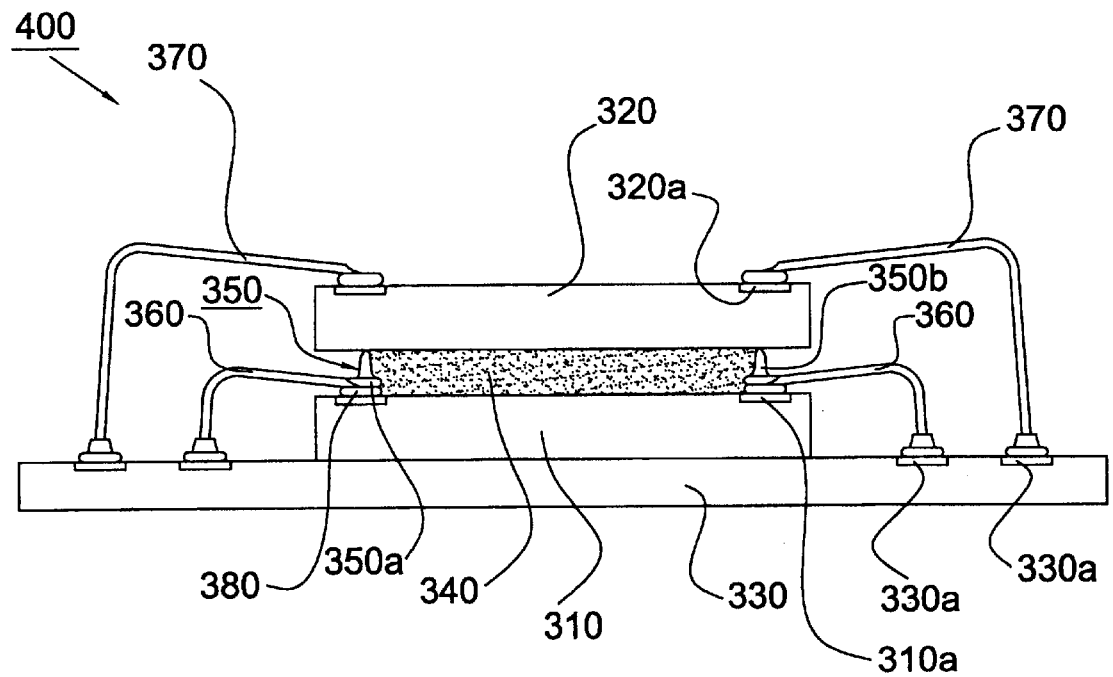
FIG. 4 is a cross sectional view of a multi-chip module according to a second preferred embodiment of the present invention wherein the package body has been removed.

FIG. 4 shows a multi-chip module 400 according to a second preferred embodiment of the present invention. The multichip module 400 is characterized by having a plurality of electrically conductive protuberances 380 attached to the bonding pads 310a of the lower chip 310. One ends of lower bonding wires 360 are connected to the conductive leads 330a of the substrate 330 by ball bonding. The other ends of wires 360 are connected to the protuberances 380 by stitch bonding. Furthermore, there are also a plurality of electrically conductive bumps 350 interposed between the two chips wherein the conductive bumps 350 are attached to the stitch bonding ends of the bonding wires 360 and connected to the backside surface of the upper chip 320 so as to support it. It should be understood that, in the second preferred embodiment of the present invention, proper clearance between the two chips can be ensured to keep the upper chip 320 from damaging the bonding wires 360 on condition that each of the four corners of the lower chip 310 is provided with several conductive bumps 350.

Figure 5:
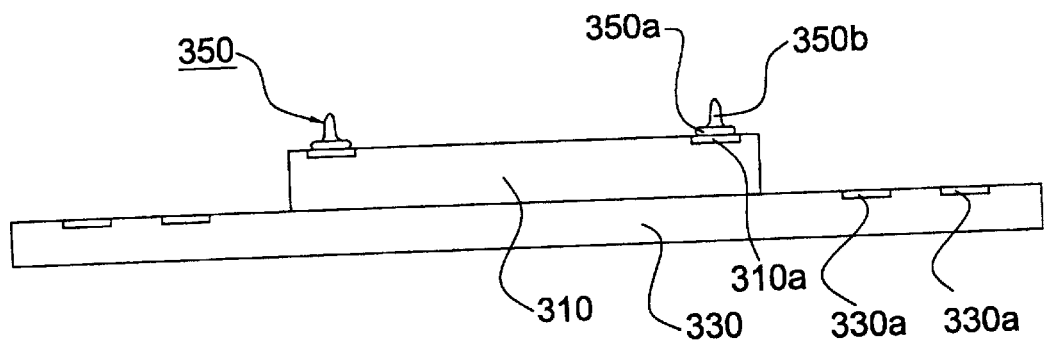
FIGS. 5–7 illustrate a method of making the multi-chip module of FIG. 3.
Figure 6:
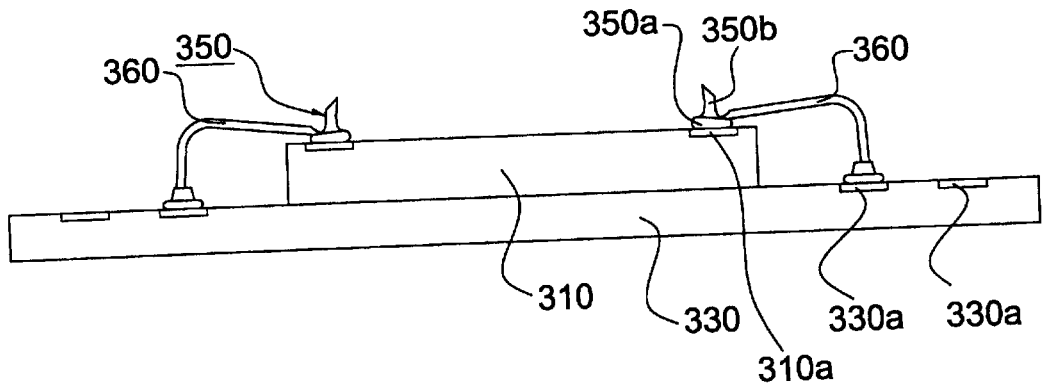
Figure 7:
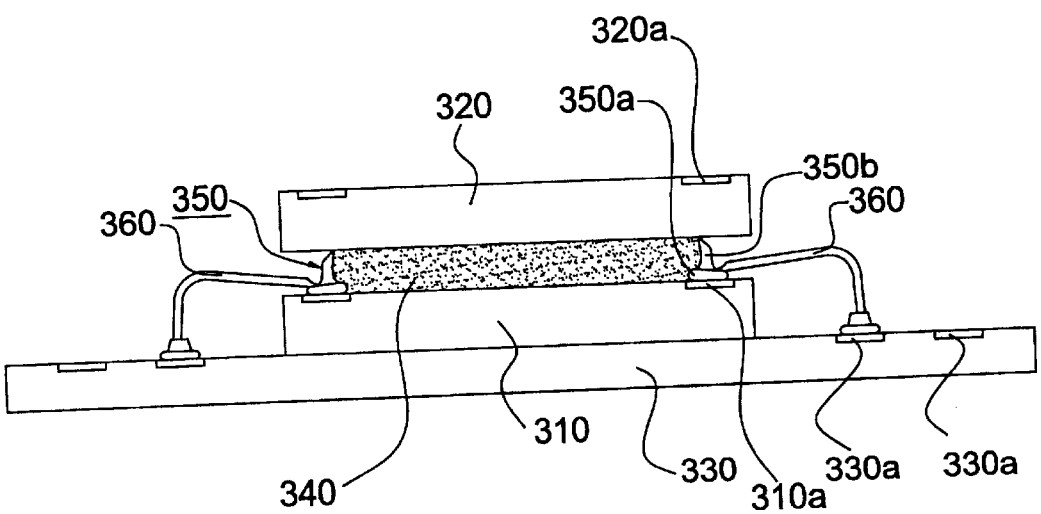

FIGS. 5–7 show a method of making the multi-chip module 300 according to a first preferred embodiment of the present invention.

Referring to FIG. 5, firstly, a chip 310 is securely attached onto the substrate 330 through an adhesive layer (not shown). Then, a plurality of conductive bumps 350 are formed on the bonding pads 310a of the chip 310 by using a conventional ball bonding tool. The conductive bumps 350 are characterized by having base portions 350a and pillar protruding portions 350b. Further, the bumps 350 are attached at their base portions 350a to the bonding pads 310a of the chip 310. Technical details for such bump formation are disclosed in copending U.S. patent application Ser. No. 09/419,288 filed Oct. 15, 1999 and assigned to the assignee of the present invention, the disclosure of which is incorporated herein by this reference.

The substrate 330 may be formed from a core layer made of fiberglass reinforced BT (bismaleimide-triazine) resin or FR-4 fiberglass reinforced epoxy resin. Alternatively, the substrate 230 may be a ceramic substrate. It should be understood that the substrate 300 may be replaced by a lead frame. Typically, the lead frame comprises a plurality of conductive leads having inner lead portions and outer lead portions wherein the inner lead portions thereof are adapted to be electrically connected to a semiconductor chip and the outer lead portions thereof are used for making electrical connection to outside.

Then, referring to FIG. 6, using a ball bonding tool, first ball bonding one ends of the bonding wires 360 to the conductive leads 330a of the substrate 330 and thereafter stitch bonding the other ends thereof to the base portions 350a of the bumps 350. Preferably, the bonding wires 360 are bent to form a substantially right angle whereby the conductive leads 330a can be designed closer to the chip 310 without risk of contacting between the wire loop and the chip.

Referring to FIG. 7, the adhesive layer 340 is applied onto the active surface of the chip 310 by dispensing, and then the chip 320 is attached thereon by conventional automatic chip-attach operation. Since the chip 320 is placed into the adhesive layer 340 until contacting the pillar protruding portions 350b of the bumps 350, it is easy to form an adhesive layer with a stable bond line thickness by controlling the height of the bumps 350. The stable bond line thickness can provide a satisfactory coplanarity of the upper chip 320 and ensure no contact between the chip 320 and the wires 360 thereby enhancing the reliability thereof. Preferably, the adhesive layer 340 is formed from nonconductive adhesives made of thermosetting material such as epoxies, silicones or polyamides.

Referring to FIG. 3 again, after curing the adhesive layer 340, the bonding wires 370 may be formed by using the wire bonding technique disclosed in U.S. Pat. No. 5,735,030. Alternatively, traditional wire bonding techniques also can be used to form the wire interconnection between the bonding pad 320a and the conductive leads 330a, i.e., making a ball bond to the bonding pad 320a, forming a loop therebetween, and making a stitch bond to the conductive leads 330a to finish the wire interconnection.

Figure 8:
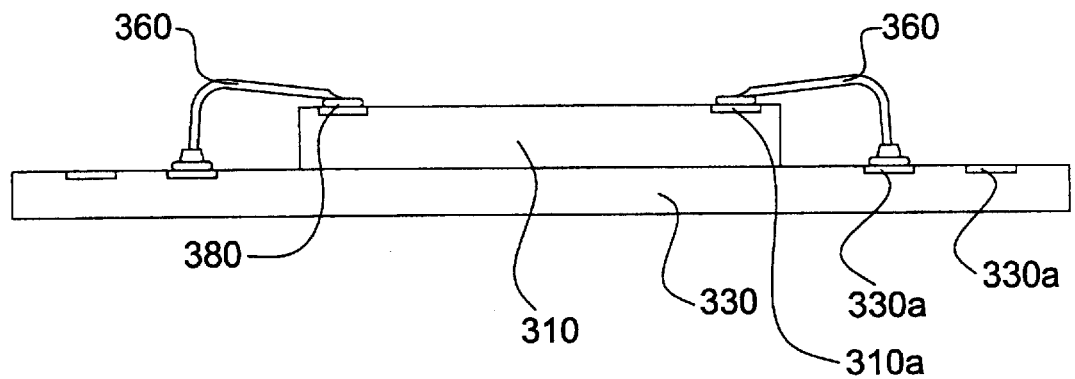
FIGS. 8–10 illustrate a method of making the multi-chip module of FIG. 4.
Figure 9:
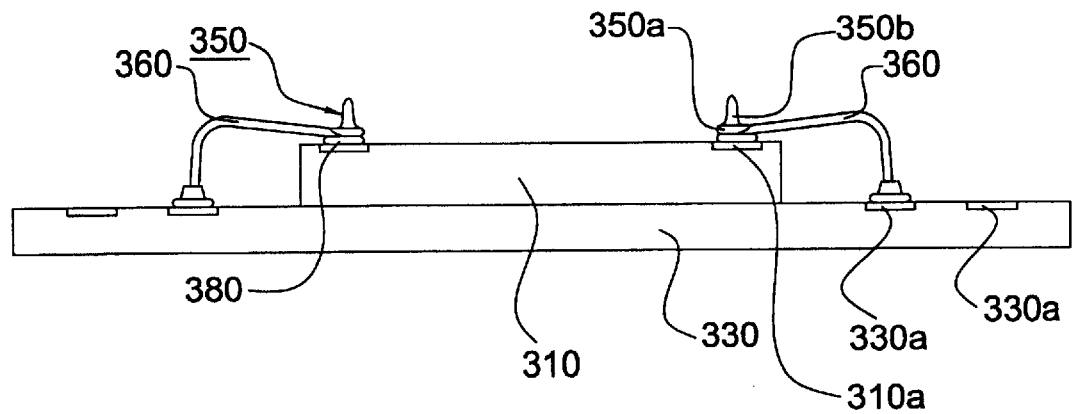
Figure 10:
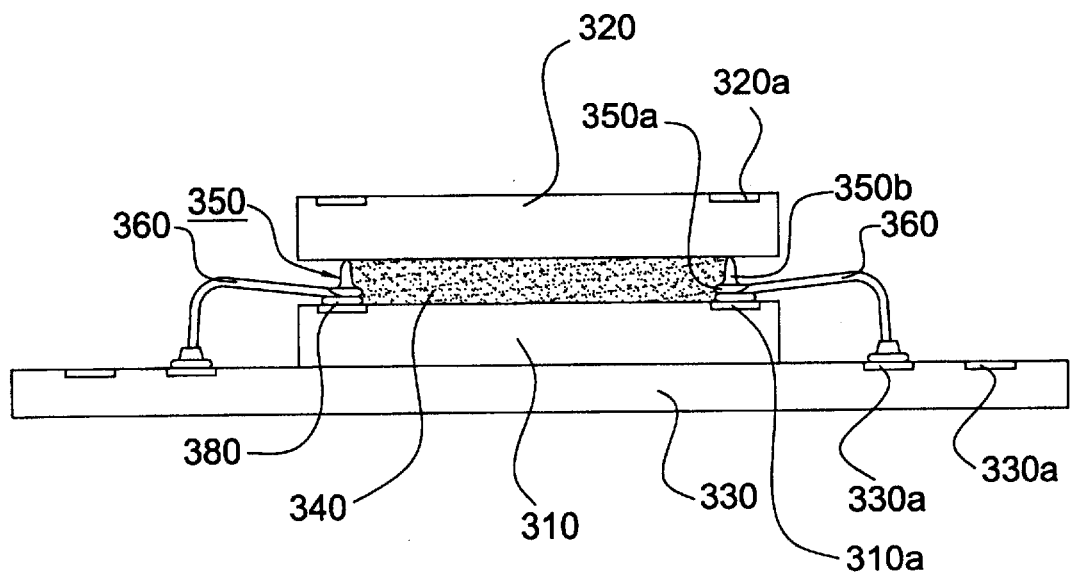

FIGS. 8–10 show a method of making the multi-chip module 400 according to a second preferred embodiment of the present invention.

Referring to FIG. 8, firstly, a chip 310 is securely attached onto the substrate 330 through an adhesive layer (not shown). Then, using wire bonding technique disclosed in U.S. Pat. No. 5,735,030, a protuberance 380 is formed on the bonding pads 310a of the chip 310, and then ball bonding one ends of the bonding wires 360 to the conductive leads 330a of the substrate 330 and stitch bonding the other ends thereof to the protuberance 380. Preferably, the bonding wires 360 are bent to form a substantially right angle.

Referring to FIG. 9, a plurality of conductive bumps 350 are formed onto the stitch bonding ends of the bonding wires 360 by using a conventional ball bonding tool. Technical details for such bump formation are disclosed in copending U.S. patent application Ser. No. 09/419,288 filed Oct. 15, 1999. In this embodiment, bump formation may be accomplished by using a different method disclosed in copending U.S. patent application Ser. No. 09/460,093 filed Dec. 13, 1999. Both of the above identified applications are assigned to the present assignee and incorporated by reference in its entirety. Even conductive bumps 350 in this embodiment are provided only on four corners of the lower chip 310, proper clearance for the bonding wires 360 still can be ensured to prevent the to-be-mounted upper chip from damaging the bonding wires 360.

Referring to FIG. 10, the adhesive layer 340 is applied onto the active surface of the chip 310 by dispensing, and then the chip 320 is attached thereon by conventional automatic chip-attach operation. After that, the remaining procedures of making the multi-chip module 400 are substantially the same as those described above.

Figure 12:
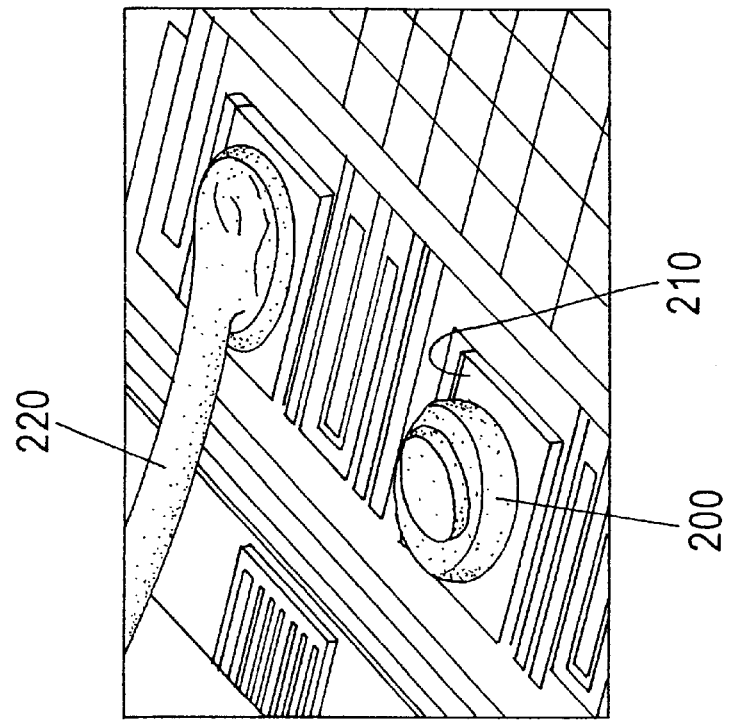
FIG. 12 is a perspective view showing two protuberances disclosed in U.S. Pat. No. 5,735,030 and a wire having one end stitch bonding to one of the protuberances on an enlarged scale.
Figure 11:
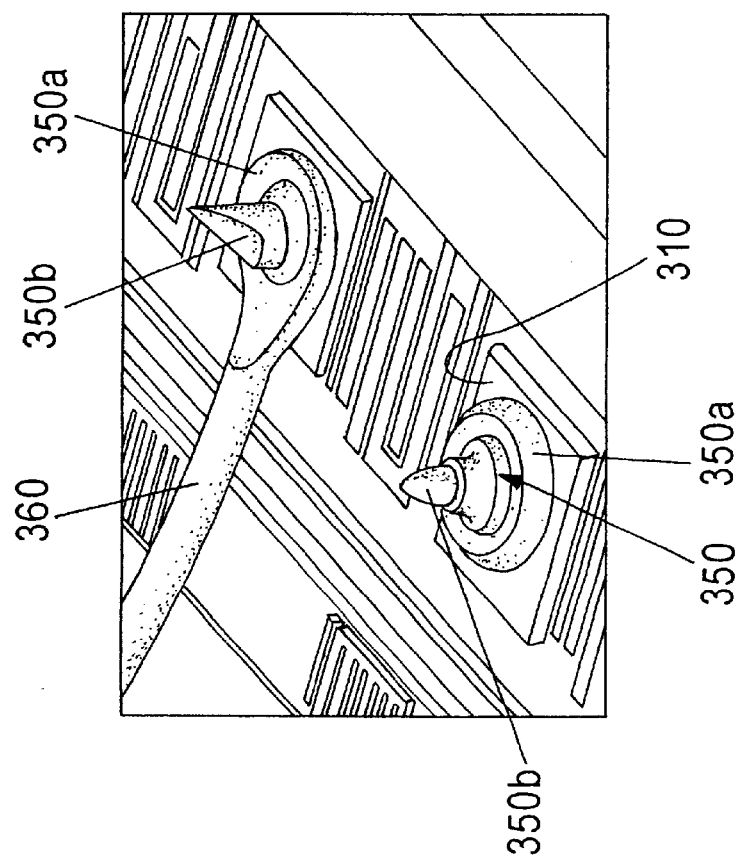
FIG. 11 is a perspective view showing two electrically conductive bumps and a wire having one end stitch bonding to one of the bumps on an enlarged scale.

Referring to FIG. 11 and FIG. 12, according to the wire bonding method disclosed in U.S. Pat. No. 5,735,030, the connection structure formed by stitch bonding on end of the wire 220 to the protuberance 200 has a substantially flat surface without any significant protrusion. Thus, it is quite difficult for the connection structure formed by the method disclosed in U.S. Pat. No. 5,735,030 to provide a sufficient clearance for the bonding wires 220. In comparison with U.S. Pat. No. 5,735,030, the connection structure of the present invention still has a pillar protruding portion 350b that is substantially unaffected by stitch bonding of the wire 360 to the conductive bump 350. Therefore, the connection structure of the present invention is capable of providing clearance for the bonding wires 360.

To summarize, the multi-chip module of the present invention is characterized by having a plurality of electrically conductive bumps interposed between stacked chips. The conductive bumps helps to provide clearance between the stacked chips thereby keeping upper chips from damaging the bonding wires of lower chips. Furthermore, it is easy to obtain a stable bond line thickness through controlling the height of the bumps thereby providing improved coplanarity of the upper chips.

Although the invention has been explained in relation to its preferred embodiment, it is to be understood that many other possible modifications and variations can be made without departing from the spirit and scope of the invention as hereinafter claimed.

What is claimed is:

1. A multichip module comprising:
   means for supporting chips, the supporting means being provided with a plurality of conductive leads;
   a first chip disposed on the supporting means, the first chip having a plurality of bonding pads formed on the active surface thereof;
   a second chip positioned over the first chip, the second chip having a plurality of bonding pads formed on the active surface thereof;

a plurality of electrically conductive bumps having base portions and pillar protruding portions, the bumps being attached at their base portions to the bonding pads of the first chip and connected at their pillar protruding portions to the backside surface of the second chip so as to support the second chip;

an adhesive layer interposed between the first and the second chips;

a plurality of first bonding wires having one ends connected to the conductive leads by ball bonding and the other ends connected to the base portions of the bumps on the bonding pads of the first chip by stitch bonding; and a plurality of second bonding wires connected between the conductive leads and the bonding pads of the second chip, wherein the pillar protruding portions of bumps help to provide clearance between the first and second chips for the first bonding wires.

2. The multichip module as claimed in claim 1, further comprising a package body encapsulating the first and the second chips as well as the first and second bonding wires against a portion of the supporting means.

3. The multichip module as claimed in claim 1, wherein the first bonding wires are bent to form a substantially right angle.

4. The multichip module as claimed in claim 1, wherein the adhesive layer is an electrically nonconductive adhesive.

5. The multichip module as claimed in claim 1, wherein the second bonding wires have one ends connected to the conductive leads by ball bonding and the other ends connected to the bonding pads of the second chip by stitch bonding.

6. The multichip module as claimed in claim 1, wherein the supporting means is a substrate.

7. The multichip module as claimed in claim 1, wherein the supporting means is a lead frame.

8. A muitichip module comprising:

means for supporting chips, the supporting means being provided with a plurality of conductive leads;

a first chip disposed on the supporting means, the first chip having a plurality of bonding pads formed on the active surface thereof;

a second chip positioned over the first chip, the second chip having a plurality of bonding pads formed on the active surface thereof;

a plurality of electrically conductive protuberances attached to the bonding pads of the first chip;

a plurality of first bonding wires having one ends connected to the conductive leads by ball bonding and the other ends connected to the protuberances on the bonding pads of the first chip by stitch bonding;

a plurality of electrically conductive bumps attached to the stitch bonding ends of first bonding wires and connected to the backside surface of the second chip so as to support the second chip;

an adhesive layer interposed between the first and the second chips; and a plurality of second bonding wires connected between the conductive leads and the bonding pads of the second chip, wherein the conductive bumps help to provide clearance between the first and second chips for the first bonding wires.

9. The multichip module as claimed in claim 8, further comprising a package body encapsulating the first and the second chips as well as the first and second bonding wires against a portion of the supporting means.

10. The multichip module as claimed in claim 8, wherein the conductive bumps have base portions and pillar protruding portions, and the bumps are attached at their base portions to the stitch bonding ends of first bonding wires and connected at their pillar protruding portions to the backside surface of the second chip.

11. The multichip module as claimed in claim 8, wherein the first bonding wires are bent to form a substantially right angle.

12. The multichip module as claimed in claim 8, wherein the adhesive layer is an electrically nonconductive adhesive.

13. The multichip module as claimed in claim 8, wherein the second bonding wires have one ends connected to the conductive leads by ball bonding and the other ends connected to the bonding pads of the second chip by stitch bonding.

14. The multichip module as claimed in claim 8, wherein the supporting means is a substrate.

15. The multichip module as claimed in claim 8, wherein the supporting means is a lead frame.

* * * * *